United States Patent
Plett

(10) Patent No.: US 7,965,059 B2
(45) Date of Patent: *Jun. 21, 2011

(54) SYSTEM, METHOD, AND ARTICLE OF MANUFACTURE FOR DETERMINING AN ESTIMATED BATTERY PARAMETER VECTOR

(75) Inventor: Gregory L. Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/756,518

(22) Filed: Apr. 8, 2010

(65) Prior Publication Data
US 2010/0191491 A1 Jul. 29, 2010

Related U.S. Application Data

(62) Division of application No. 11/290,962, filed on Nov. 30, 2005, now Pat. No. 7,723,957.

(51) Int. Cl.
*H02J 7/00* (2006.01)
*G01N 27/416* (2006.01)
(52) U.S. Cl. .................. 320/132; 320/133; 324/426
(58) Field of Classification Search .................. 320/132
See application file for complete search history.

(56) References Cited

U.S. PATENT DOCUMENTS

| | | | |
|---|---|---|---|
| 4,390,841 A | 6/1983 | Martin et al. |
| 4,707,795 A | 11/1987 | Alber et al. |
| 5,350,951 A | 9/1994 | Adachi |
| 5,469,042 A | 11/1995 | Ruhling |
| 5,498,950 A | 3/1996 | Ouwerkerk |
| 5,574,633 A | 11/1996 | Prater |
| 5,578,915 A | 11/1996 | Crouch, Jr. et al. |
| 5,592,095 A | 1/1997 | Meadows |
| 5,606,242 A | 2/1997 | Hull et al. |
| 5,644,212 A | 7/1997 | Takahashi |
| 5,652,502 A | 7/1997 | van Phuoc et al. |
| 5,658,682 A | 8/1997 | Usuda et al. |
| 5,666,041 A | 9/1997 | Stuart et al. |
| 5,694,335 A | 12/1997 | Hollenberg |
| 5,701,068 A | 12/1997 | Baer et al. |
| 5,705,914 A | 1/1998 | Morita |

(Continued)

FOREIGN PATENT DOCUMENTS

DE 102004036302 A1 * 3/2005

(Continued)

OTHER PUBLICATIONS

Stephen W. Moore and Peter J. Schneider; A Review of Cell Equalization Methods for Lithium Ion and Lithium Polymer Battery Systems; 2001 Society of Automotive Engineers; Jan. 2001; pp. 1-5.
Gregory L. Plett; Advances in EKF SOC Estimation for LiPB HEV Battery Packs; Powering Sustainable Transportation EVS 20; Nov. 15-19, 2003; Long Beach, CA; pp. 1-12.
Greg Welch and Gary Bishop; An Introduction to the Kalman Filter; SIGGRAPH 2001 Course 8; Los Angeles, CA; Aug. 12-17, 2001; http://info.acm.org/pubs/toc/Crnotice.html; pp. 1-47.

(Continued)

*Primary Examiner* — Edward Tso
*Assistant Examiner* — Yalkew Fantu
(74) *Attorney, Agent, or Firm* — Cantor Colburn LLP

(57) ABSTRACT

A system, a method, and an article of manufacture for determining an estimated battery parameter vector indicative of a parameter of a battery are provided. The method determines a first estimated battery parameter vector indicative of a parameter of the battery at a first predetermined time based on a plurality of predicted battery parameter vectors, a plurality of predicted battery output vectors, and a first battery output vector.

4 Claims, 8 Drawing Sheets

U.S. PATENT DOCUMENTS

| | | | |
|---|---|---|---|
| 5,714,866 A | 2/1998 | S et al. | |
| 5,739,670 A | 4/1998 | Brost et al. | |
| 5,796,239 A | 8/1998 | van Phuoc et al. | |
| 5,825,155 A | 10/1998 | Ito et al. | |
| 5,844,399 A | 12/1998 | Stuart | |
| 5,936,385 A | 8/1999 | Patillon et al. | |
| 6,014,013 A | 1/2000 | Suppanz et al. | |
| 6,014,030 A | 1/2000 | Smith et al. | |
| 6,016,047 A | 1/2000 | Notten et al. | |
| 6,064,180 A | 5/2000 | Sullivan et al. | |
| 6,160,376 A | 12/2000 | Kumar et al. | |
| 6,215,282 B1 | 4/2001 | Richards et al. | |
| 6,232,744 B1 | 5/2001 | Kawai et al. | |
| 6,285,163 B1 | 9/2001 | Watanabe et al. | |
| 6,285,191 B1 | 9/2001 | Gollomp et al. | |
| 6,329,792 B1 | 12/2001 | Dunn et al. | |
| 6,329,823 B2 | 12/2001 | Blessing et al. | |
| 6,337,555 B1 | 1/2002 | Oh | |
| 6,340,889 B1 | 1/2002 | Sakurai | |
| 6,353,815 B1 | 3/2002 | Vilim et al. | |
| 6,359,419 B1 | 3/2002 | Verbrugge et al. | |
| 6,362,598 B2 | 3/2002 | Laig-Horstebrock et al. | |
| 6,441,586 B1 | 8/2002 | Tate, Jr. et al. | |
| 6,452,363 B1 | 9/2002 | Jabaji | |
| 6,459,236 B2 | 10/2002 | Kawashima | |
| 6,504,344 B1 | 1/2003 | Adams et al. | |
| 6,515,454 B2 | 2/2003 | Schoch | |
| 6,534,954 B1 | 3/2003 | Plett | |
| 6,563,318 B2 | 5/2003 | Kawakami et al. | |
| 6,583,606 B2 | 6/2003 | Koike et al. | |
| 6,608,482 B2 | 8/2003 | Sakai et al. | |
| 6,646,421 B2 | 11/2003 | Kimura et al. | |
| 6,661,201 B2 | 12/2003 | Ueda et al. | |
| 6,724,172 B2 | 4/2004 | Koo | |
| 6,762,590 B2 | 7/2004 | Yudahira | |
| 6,829,562 B2 | 12/2004 | Sarfert | |
| 6,832,171 B2 | 12/2004 | Barsoukov et al. | |
| 6,876,175 B2 | 4/2005 | Schoch | |
| 6,892,148 B2 | 5/2005 | Barsoukov et al. | |
| 6,927,554 B2 | 8/2005 | Tate, Jr. et al. | |
| 6,943,528 B2 | 9/2005 | Schoch | |
| 6,967,466 B2 | 11/2005 | Koch | |
| 6,984,961 B2 | 1/2006 | Kadouchi et al. | |
| 7,012,434 B2 | 3/2006 | Koch | |
| 7,039,534 B1 | 5/2006 | Ryno et al. | |
| 7,061,246 B2 | 6/2006 | Dougherty et al. | |
| 7,072,871 B1 | 7/2006 | Tinnemeyer | |
| 7,098,665 B2 | 8/2006 | Laig-Hoerstebrock | |
| 7,109,685 B2 | 9/2006 | Tate, Jr. et al. | |
| 7,126,312 B2 | 10/2006 | Moore | |
| 7,136,762 B2 | 11/2006 | Ono | |
| 7,138,775 B2 | 11/2006 | Sugimoto et al. | |
| 7,197,487 B2 | 3/2007 | Hansen et al. | |
| 7,199,557 B2 | 4/2007 | Anbuky et al. | |
| 7,233,128 B2 | 6/2007 | Brost et al. | |
| 7,250,741 B2 | 7/2007 | Koo et al. | |
| 7,251,889 B2 | 8/2007 | Kroliczek et al. | |
| 7,253,587 B2 | 8/2007 | Meissner | |
| 7,315,789 B2 | 1/2008 | Plett | |
| 7,317,300 B2 | 1/2008 | Sada et al. | |
| 7,321,220 B2 | 1/2008 | Plett | |
| 7,327,147 B2 | 2/2008 | Koch | |
| 7,400,115 B2 | 7/2008 | Plett | |
| 7,446,504 B2 | 11/2008 | Plett | |
| 7,518,339 B2 | 4/2009 | Schoch | |
| 7,521,895 B2 * | 4/2009 | Plett | 320/132 |
| 7,525,285 B2 | 4/2009 | Plett | |
| 7,583,059 B2 | 9/2009 | Cho | |
| 7,589,532 B2 | 9/2009 | Plett | |
| 7,593,821 B2 | 9/2009 | Plett | |
| 7,656,122 B2 | 2/2010 | Plett | |
| 7,656,123 B2 | 2/2010 | Plett | |
| 2003/0015993 A1 | 1/2003 | Misra et al. | |
| 2003/0184307 A1 | 10/2003 | Kozlowski et al. | |
| 2005/0046388 A1 * | 3/2005 | Tate et al. | 320/132 |
| 2005/0127874 A1 | 6/2005 | Lim et al. | |
| 2005/0194936 A1 * | 9/2005 | Cho, II | 320/132 |
| 2006/0100833 A1 | 5/2006 | Plett | |
| 2007/0120533 A1 | 5/2007 | Plett | |
| 2008/0249725 A1 | 10/2008 | Plett | |
| 2008/0249726 A1 * | 10/2008 | Plett | |
| 2009/0030627 A1 * | 1/2009 | Plett | |
| 2009/0189613 A1 * | 7/2009 | Plett | |
| 2009/0261837 A1 * | 10/2009 | Plett | |
| 2009/0327540 A1 * | 12/2009 | Robertson et al. | |

FOREIGN PATENT DOCUMENTS

| | | |
|---|---|---|
| JP | 9171065 A | 6/1997 |
| JP | 9243716 A | 9/1997 |
| JP | 9312901 A | 12/1997 |
| JP | 11023676 A * | 1/1999 |
| JP | 11032442 A * | 2/1999 |
| JP | 11038105 A * | 2/1999 |
| JP | 2002048849 A | 2/2002 |
| JP | 2002075461 A | 3/2002 |
| JP | 200228730 A | 8/2002 |
| JP | 2002319438 A | 10/2002 |
| JP | 2002325373 A | 11/2002 |
| JP | 2003249271 A | 9/2003 |
| JP | 2003257501 A | 9/2003 |
| WO | WO99/01918 A2 | 1/1999 |
| WO | WO00/67359 A1 | 11/2000 |
| WO | WO2007/024093 A1 | 3/2007 |

OTHER PUBLICATIONS

Eric A. Wan and Alex T. Nelson; Dual Extended Kalman Filter Methods; Kalman Filtering and Neural Networks; 2001; pp. 123-173.

Yon et al., Abstract: Dynamic Multidimensional Wavelet Neural Network and its Application; 2000; Journal of Advanced Computational Inteligence and Inteligent Informatics; vol. 4, No. 5; pp. 336-340.

A.K. Fletcher, S. Rangen, V.K. Goyal; Estimation from Lossy Sensor Data: Jump Linear Modeling and Kalman Filtering; IPSN Apr. 26-27, 2004; Berkeley, CA; pp. 251-258.

Gregory L. Plett; Extended Kalman Filtering for Battery Management Systems of LiPB-based HEV Battery Packs Part 1 Background; Journal of Power Sources 134; 2004; pp. 225-261.

Gregory L. Plett; Extended Kalman Filtering for Battery Management Systems of LiPB-based HEV Battery Packs Part 2 Modeling and Identification; Journal of Power Sources 134; 2004; pp. 262-276.

Gregory L. Plett; Extended Kalman Filtering for Battery Management Systems of LiPB-based HEV Battery Packs Part 3 State and Parameter Estimation; Journal of Power Sources 134; 2004; pp. 277-292.

International Search Report dated Mar. 9, 2007 for International Application No. PCT/KR2006/005089.

International Search Report dated Mar. 31, 2005 for International Application No. PCT/KR2004/003332.

International Search Report dated Dec. 1, 2006 for International Application No. PCT/KR2006/003305.

Gregory L. Plett; Kalman-Filter SOC Estimation for LiPB HEV Cells; The 19th International Battery, Hybrid and Fuel Electric Vehicle Symposium and Exhibition; Oct. 19-23, 2002; Busan, Korea; pp. 1-12.

Gregory L. Plett; LiPB Dynamic Cell Models for Kalman-Filter SOC Estimation; The 19th International Battery, Hybrid and Fuel Electric Vehicle Symposium and Exhibition; Oct. 19-23, 2002; Busan, Korea; pp. 1-12.

S. C. Rutan; Recursive Parameter Estimation; Journal of Chemometrics, vol. 4, 102-121 (1990).

Peter S. Maybeck; Stochastic models, estimation, and control, vol. 1; Department of Electrical Engineering Air Force Institute of Technology Wright-Patterson Air Force Base, OH; Academic Press; 1979; 32 pages.

Terry Hansen, Chia-Jiu Wang; Support Vector Based Battery State of Charge Estimator; Journal of Power Sources; Sep. 24, 2004; pp. 6391; 1-8.

Valerie H. Johnson, Ahmad A. Pesaran, Thomas Sack; Temperature-Dependent Battery Models for High-Power Lithium-Ion Batteries; Jan. 2001; NREL/CP-540-28716.

* cited by examiner

_US 7,965,059 B2_

SYSTEM, METHOD, AND ARTICLE OF MANUFACTURE FOR DETERMINING AN ESTIMATED BATTERY PARAMETER VECTOR

CROSS REFERENCE TO RELATED APPLICATIONS

The present application is a divisional application of U.S. patent application Ser. No. 11/290,962, filed on Nov. 30, 2005, the contents of which are incorporated herein by reference thereto.

BACKGROUND OF THE INVENTION

Batteries are used in a wide variety of electronic and electrical devices. Mathematical algorithms have been utilized to estimate battery parameters, such as internal battery resistance. The inventor herein, however, has recognized that the mathematical algorithms have been unable to provide a highly accurate estimate of internal battery parameters because they are not sufficiently optimized for batteries having non-linear operational characteristics.

Accordingly, the inventor herein has recognized a need for a system and a method for more accurately determining battery parameters.

BRIEF DESCRIPTION OF THE INVENTION

A method for determining an estimated battery parameter vector indicative of a parameter of a battery at a first predetermined time in accordance with an exemplary embodiment is provided. The method includes determining a first plurality of predicted battery parameter vectors that are indicative of the parameter of the battery and an uncertainty of the parameter of the battery at the first predetermined time. The method further includes determining a battery state vector having at least one value indicative of a battery state at the first predetermined time. The method further includes determining a second plurality of predicted battery output vectors that are indicative of at least one output variable of the battery and an uncertainty of the output variable at the first predetermined time based on the first plurality of predicted battery parameter vectors and the battery state vector. The method further includes determining a first battery output vector having at least one measured value of a battery output variable obtained at the first predetermined time. The method further includes determining a first estimated battery parameter vector indicative of the parameter of the battery at the first predetermined time based on the first plurality of predicted battery parameter vectors, the second plurality of predicted battery output vectors, and the first battery output vector.

A system for determining an estimated battery parameter vector indicative of a parameter of a battery at a first predetermined time in accordance with another exemplary embodiment is provided. The system includes a sensor configured to generate a first signal indicative of an output variable of the battery. The system further includes a computer operably coupled to the sensor. The computer is configured to determine a first plurality of predicted battery parameter vectors that are indicative of the parameter of the battery and an uncertainty of the parameter of the battery at the first predetermined time. The computer is further configured to determine a battery state vector having at least one value indicative of a battery state at the first predetermined time. The computer is further configured to determine a second plurality of predicted battery output vectors that are indicative of at least one output variable of the battery and an uncertainty of the output variable at the first predetermined time based on the first plurality of predicted battery parameter vectors and the battery state vector. The computer is further configured to determine a first battery output vector based on the first signal. The computer is further configured to determine a first estimated battery parameter vector indicative of the parameter of the battery at the first predetermined time based on the first plurality of predicted battery parameter vectors, the second plurality of predicted battery output vectors, and the first battery output vector.

An article of manufacture in accordance with another exemplary embodiment is provided. The article of manufacture includes a computer storage medium having a computer program encoded therein for determining an estimated battery parameter vector indicative of a parameter of a battery at a first predetermined time. The computer storage medium includes code for determining a first plurality of predicted battery parameter vectors that are indicative of the parameter of the battery and an uncertainty of the parameter of the battery at the first predetermined time. The computer storage medium further includes code for determining a battery state vector having at least one value indicative of a battery state at the first predetermined time. The computer storage medium further includes code for determining a second plurality of predicted battery output vectors that are indicative of at least one output variable of the battery and an uncertainty of the output variable at the first predetermined time based on the first plurality of predicted battery parameter vectors and the battery state vector. The computer storage medium further includes code for determining a first battery output vector having at least one measured value of a battery output variable obtained at the first predetermined time. The computer storage medium further includes code for determining a first estimated battery parameter vector indicative of the parameter of the battery at the first predetermined time based on the first plurality of predicted battery parameter vectors, the second plurality of predicted battery output vectors, and the first battery output vector.

Other systems and/or methods according to the embodiments will become or are apparent to one with skill in the art upon review of the following drawings and detailed description. It is intended that all such additional systems and methods be within the scope of the present invention, and be protected by the accompanying claims.

DETAILED DESCRIPTION OF THE INVENTION

Figure 1:
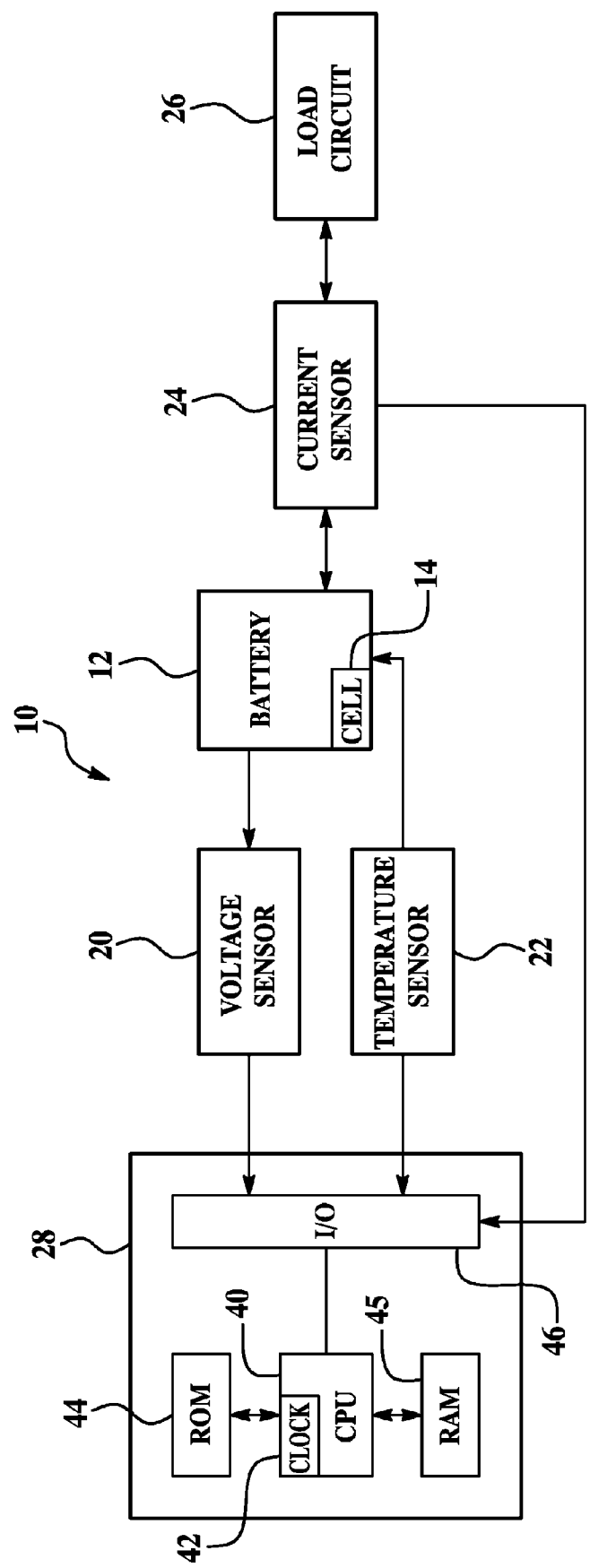
FIG. 1 is a schematic of a system for determining an estimated battery parameter vector in accordance with an exemplary embodiment.

Referring to FIG. 1, a system 10 for estimating at least one battery parameter associated with a battery 12 is illustrated. The battery 12 includes at least a battery cell 14. Of course, the battery 12 can include a plurality of additional battery cells. Each battery cell can be either a rechargeable battery cell or a non-rechargeable battery cell. Further, each battery cell can be constructed using an anode and a cathode having electro-chemical configurations known to those skilled in the art.

In the context of rechargeable battery pack technologies, it is desired in some applications to be able to estimate quantities that are descriptive of the present battery pack condition, but that may not be directly measured. Some of these quantities may change rapidly, such as the pack state-of-charge (SOC), which can traverse its entire range within minutes. Others may change very slowly, such as cell capacity, which might change as little as 20% in a decade or more of regular use. The quantities that tend to change quickly comprise the "state" of the system, and the quantities that tend to change slowly comprise the time varying "parameters" of the system.

In the context of the battery systems, particularly those that need to operate for long periods of time, as aggressively as possible without harming the battery life, for example, in Hybrid Electric Vehicles (HEVs), Battery Electric Vehicles (BEVs), laptop computer batteries, portable tool battery packs, and the like, it is desired that information regarding slowly varying parameters (e.g., total capacity) be available to determine pack health, and to assist in other calculations, including that of state-of-charge (SOC). Some exemplary parameters include, but are not limited to: cell capacity, resistance, polarization voltage time constant(s), polarization voltage blending factor(s), hysteresis blending factor(s), hysteresis rate constant(s), efficiency factor(s), and so forth.

An input variable is defined as a value of a battery input signal at a specific time. For example, an input variable can comprise one of a current entering the battery and a temperature of the battery. An output variable is defined as a value of a battery output signal at a specific time. For example, an output variable can comprise one of a battery output voltage and a battery pressure.

The system 10 includes one or more voltage sensors 20, a load circuit 26, and a computational unit such as a computer 28, and may also include one or more of a temperature sensor 22, and a current sensor 24.

The voltage sensor 20 is provided to generate a first output signal indicative of the voltage produced by one or more of the battery cells of the battery 12. The voltage sensor 20 is electrically coupled between the I/O interface 46 of the computer 28 and the battery 12. The voltage sensor 20 transfers the first output signal to the computer 28. For clarity of presentation, a single voltage sensor will be described herein. However, it should be noted that in an alternate embodiment of system 10 a plurality of voltage sensors (e.g., one voltage sensor per battery cell) are utilized in system 10.

The temperature sensor 22 is provided to generate a second output signal indicative of one or more temperatures of the battery 12. The temperature sensor 22 is disposed proximate the battery 12 and is electrically coupled to the I/O interface 46 of the computer 28. The temperature sensor 22 transfers the second output signal to the computer 28. For clarity of presentation, a single temperature sensor will be described herein. However, it should be noted that in an alternate embodiment of system 10 a plurality of temperature sensors (e.g., one temperature sensor per battery cell) are utilized in system 10.

The current sensor 24 is provided to generate a third output signal indicative of a current sourced or sunk by the battery cells of the battery 12. The current sensor 24 is electrically coupled between the battery 12 and the load circuit 26. The current sensor 24 is further electrically coupled to the I/O interface 46 of the computer 28. The current sensor 24 transfers the third output signal to the computer 28.

The load circuit 26 is electrically coupled to the current sensor 24 and sinks or sources a current from the battery 12. The load circuit 26 comprises any electrical device that can be electrically coupled to the battery 12.

The computer 28 is provided for determining an estimated battery parameter vector associated with the battery 12, as will be explained in greater detail below. The computer 28 includes a central processing unit (CPU) 40, a read-only memory (ROM) 44, a volatile memory such as a random access memory (RAM) 45 and an input/output (I/O) interface 46. The CPU 40 operably communicates with the ROM 44, the RAM 45, and the I/O interface 46. The CPU 40 includes a clock 42. The computer readable media including ROM 44 and RAM 46 may be implemented using any of a number of known memory devices such as PROMs, EPROMs, EEPROMS, flash memory or any other electric, magnetic, optical or combination memory device capable of storing data, some of which represent executable instructions used by the CPU 40.

For purposes of understanding, the notation utilized in the equations of the following methods will be described. The circumflex symbol indicates an estimated or predicted quantity (e.g., $\hat{x}$ indicates an estimate of the true quantity x). The superscript symbol "−" indicates an a priori estimate (i.e., a prediction of a quantity's present value based on past data). The superscript symbol "+" indicates an a posteriori estimate (e.g., $\hat{x}_k^+$ is the estimate of true quantity x at time index k based on all measurements taken up to and including time k). The tilde symbol indicates the error of an estimated quantity (e.g., $\tilde{x}_k^- = x_k - \hat{x}_k^-$ and $\tilde{x}_k^+ = x_k - \hat{x}_k^+$). The symbol $\Sigma_{xy} = E[xy^T]$ indicates the correlation or cross correlation of the variables in its subscript (the quantities described herein are zero-mean, so the correlations are identical to covariances). The symbol $\Sigma_x$ indicates the same quantity as $\Sigma_{xx}$. The superscript "T" is a matrix/vector transpose operator.

Before providing a detailed discussion of the methodologies for determining a battery parameter vector associated with the battery 12, a general overview will be provided.

A battery state vector may include, for example, a state of charge (SOC) value associated with the battery 12, a hysteresis voltage, or a polarization voltage. The SOC value is a value from 0-100 percent that indicates a present available capacity of the battery 12 that may be used to do work.

A mathematical model of battery cell behavior is used in the method to compute an estimate of the state vector of the battery 12. It is assumed that a mathematical model of the battery cell dynamics is known, and may be expressed using a discrete-time state-space model comprising a state equation and an output equation, as will be described below.

The state equation utilized to determine the state vector associated with the battery 12 is as follows:

$$x_k = f(x_{k-1}, u_{k-1}, w_{k-1}, k-1)$$

wherein, $x_k$ is the state vector associated with the battery 12 at time index k;

$u_k$ is a variable representing a known/deterministic input to the battery 12;

$w_k$ is a battery input noise vector that models some unmeasured input which affects the state of the system; and $f(x_{k-1}, u_{k-1}, w_{k-1}, k-1)$ is a state transition function.

An output vector associated with the battery 12 is determined utilizing the following equation:

$$y_k = h(x_k, u_k, v_k, k)$$

wherein, $h(x_k, u_k, v_k, k)$ is a measurement function; and $v_k$ is sensor noise that affects the measurement of the output of battery 12 in a memory-less mode, but does not affect the state vector of battery 12.

The system state $x_k$ includes, at least, a minimum amount of information, together with the present input and a mathematical model of the cell, needed to predict the present output. For a cell 14, the state might include: SOC, polarization voltage levels with respect to different time constants, and hysteresis levels, for example. The system exogenous input $u_k$ includes at minimum the present cell current $i_k$ and may, optionally, include cell temperature (unless temperature change is itself modeled in the state). The system parameters $\theta_k$ are the values that change only slowly with time, in such a way that they may not be directly determined with knowledge of the system measured input and output. These might include, but not be limited to: cell capacity, resistance, polarization voltage time constant(s), polarization voltage blending factor(s), hysteresis blending factor(s), hysteresis rate constant(s), efficiency factor(s), and so forth. The model output $y_k$ corresponds to physically measurable cell quantities or those directly computable from measured quantities at minimum for example, the cell voltage under load.

A mathematical model of parameter dynamics is also utilized. An exemplary model has the form:

$$\theta_{k+1} = \theta_k + r_k$$

$$d_k = g(x_k, u_k, \theta_k) + e_k.$$

The first equation states that the parameters $\theta_k$ are primarily constant, but that they may change slowly over time, in this instance, modeled by a "noise" process denoted, $r_k$. The "output" $d_k$ is a function of the optimum parameter dynamics modeled by $g(., ., .)$ plus some estimation error $e_k$. The optimum parameter dynamics $g(., ., .)$ being a function of the system state $x_k$, an exogenous input u, and the set of time varying parameters $\theta_k$.

Figure 2:
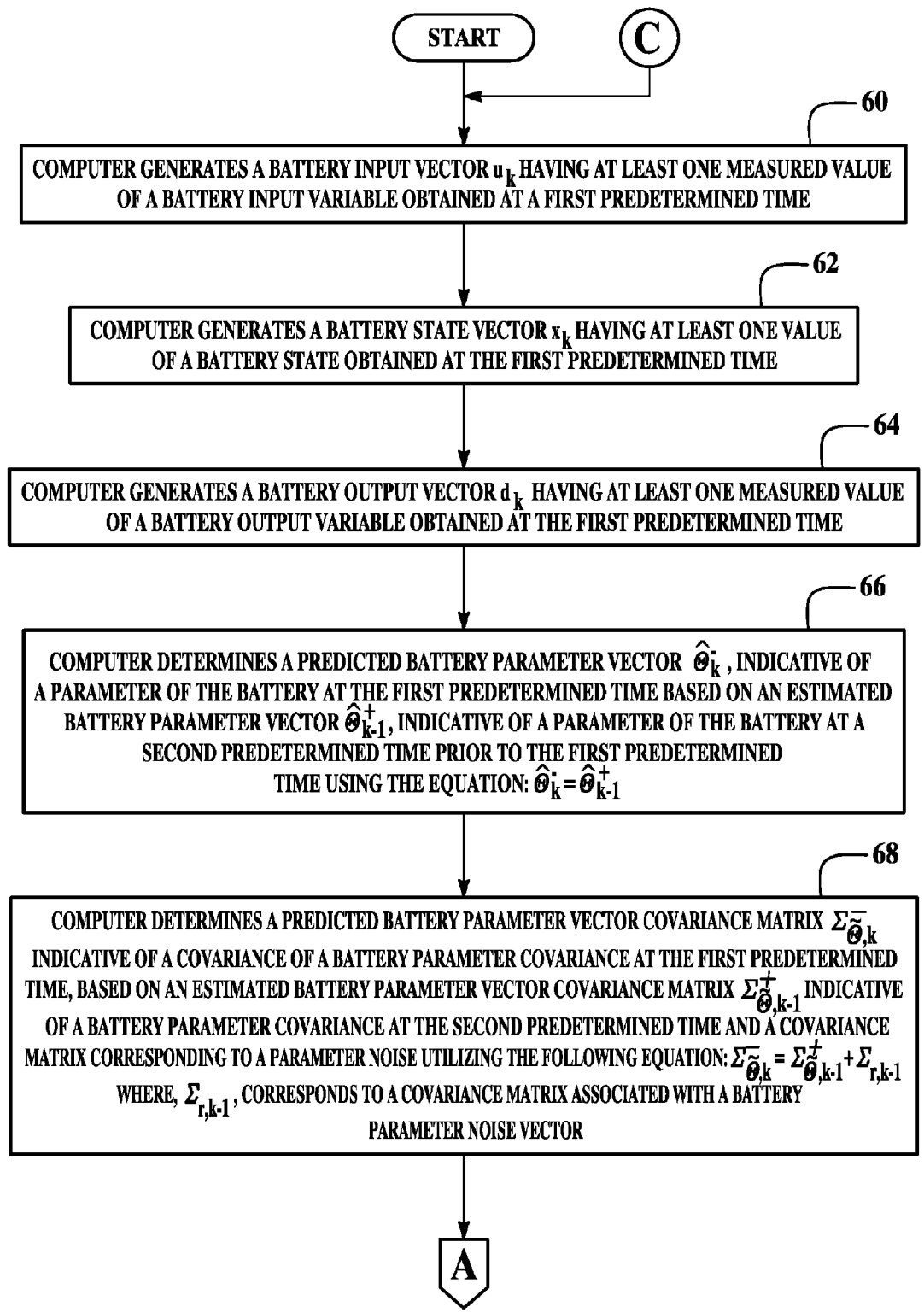
FIGS. 2-4 are flowcharts of a method for determining an estimated battery parameter vector in accordance with another exemplary embodiment.
Figure 3:
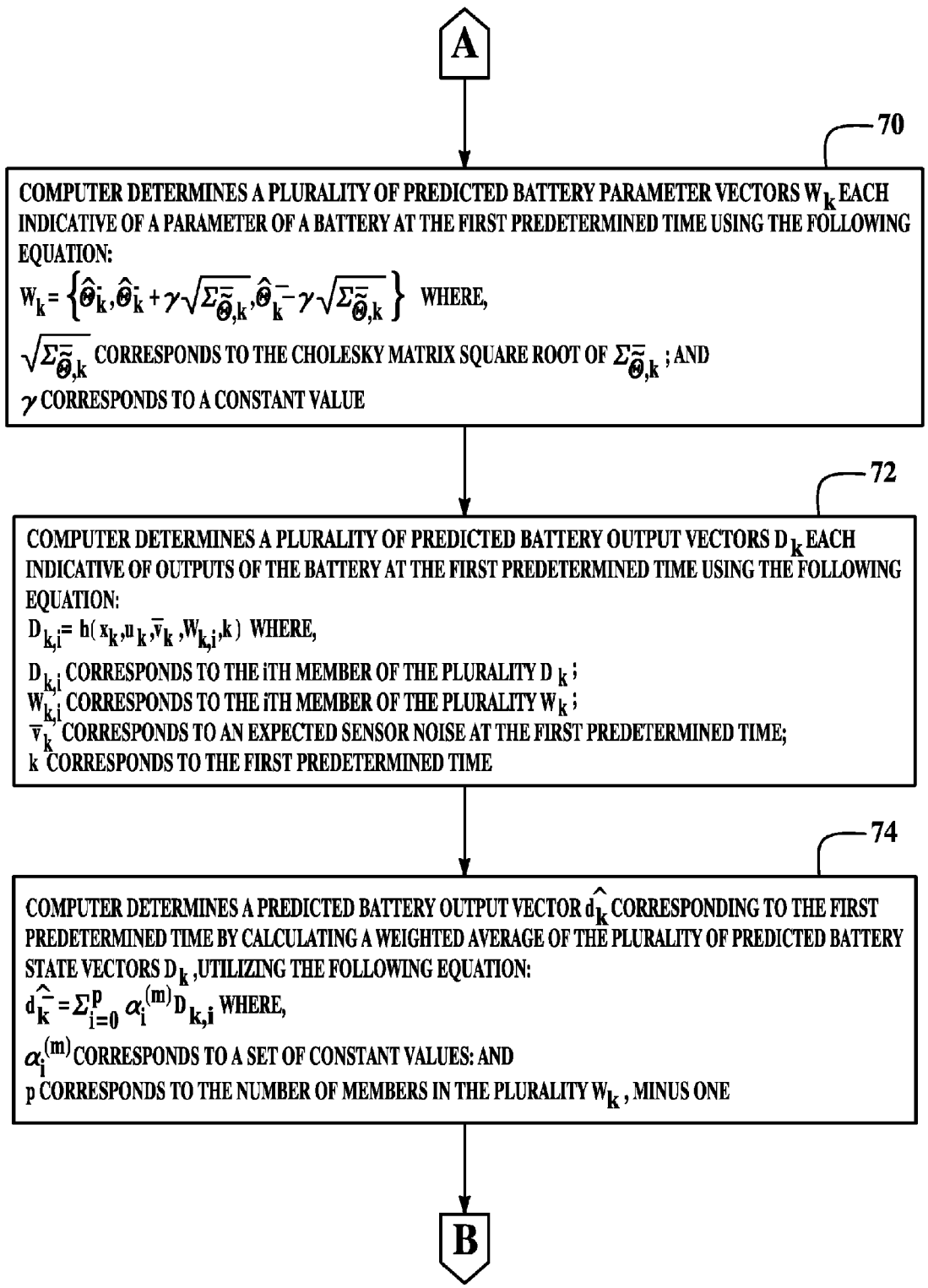
Figure 4:
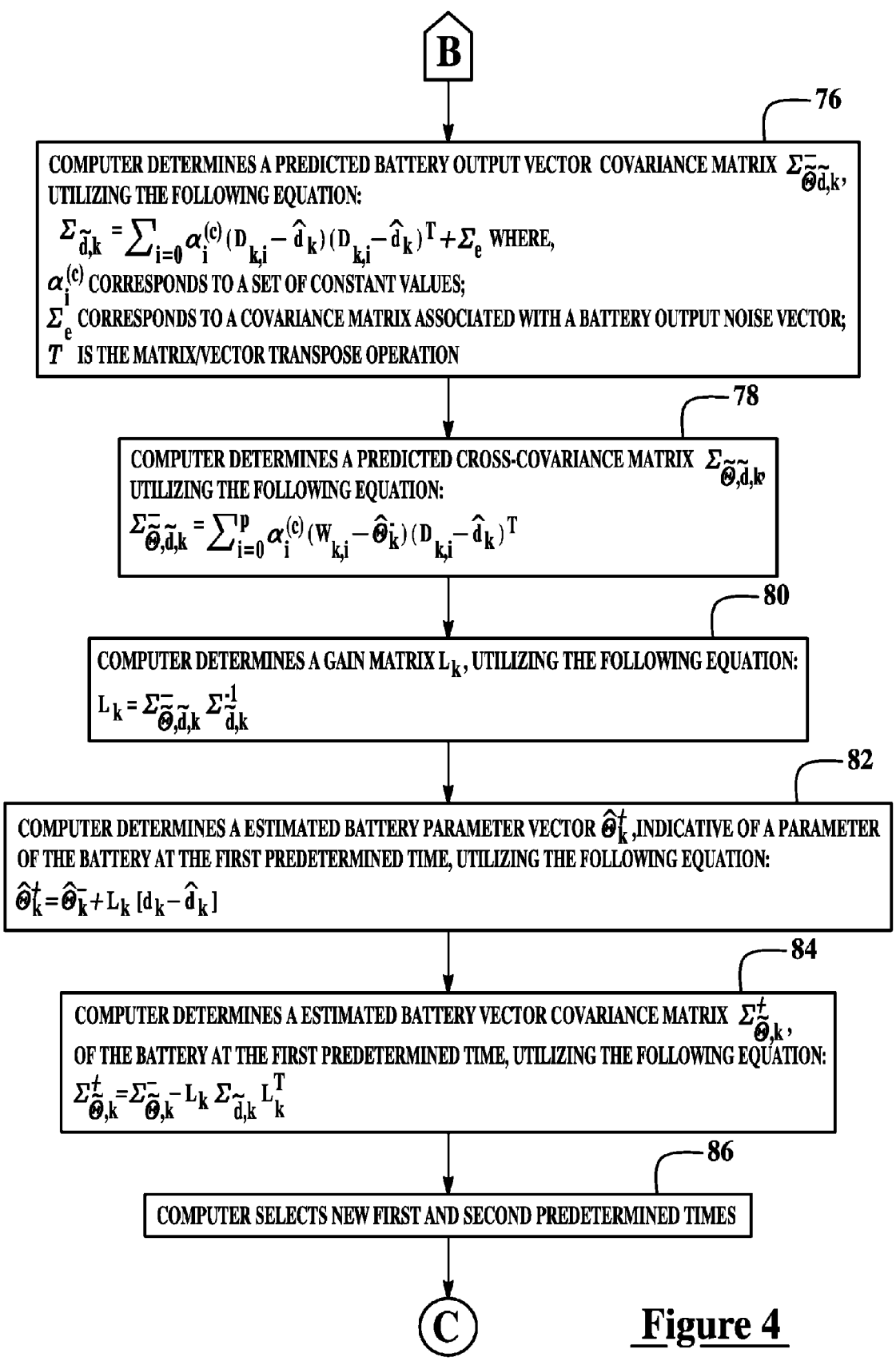
Figure 5:
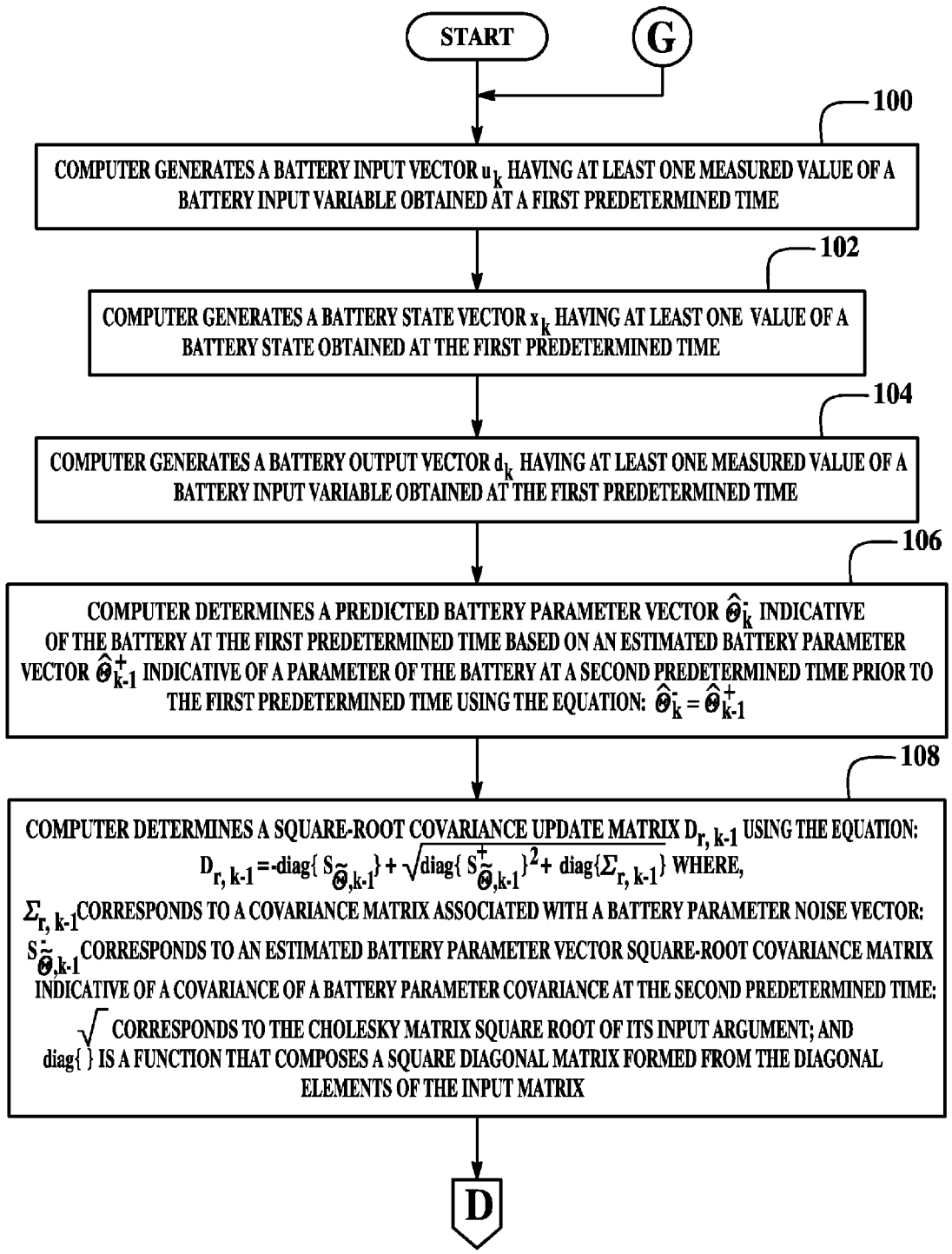
FIGS. 5-8 are flowcharts of a method for determining an estimated battery parameter vector in accordance with another exemplary embodiment.
Figure 6:
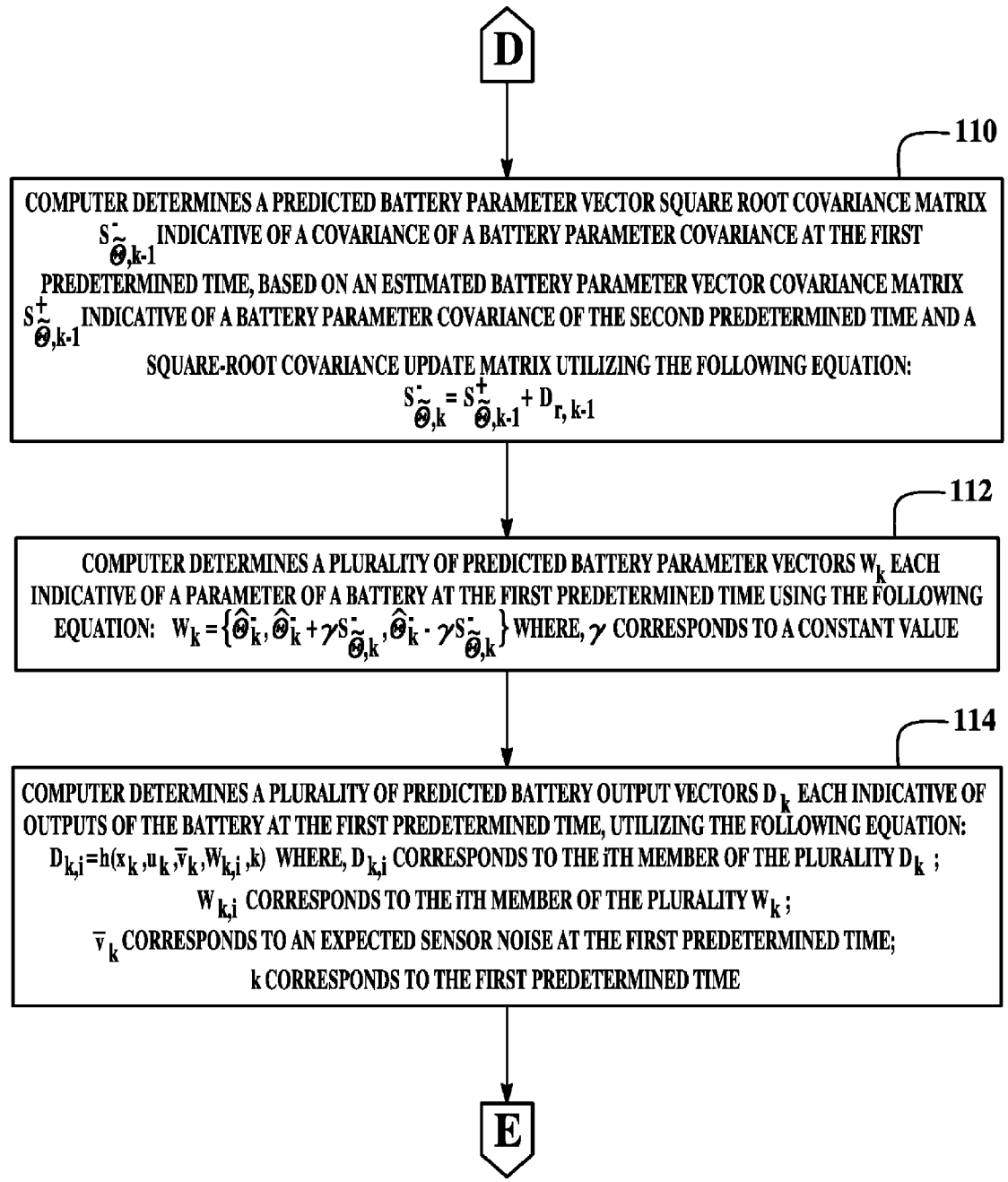
Figure 7:
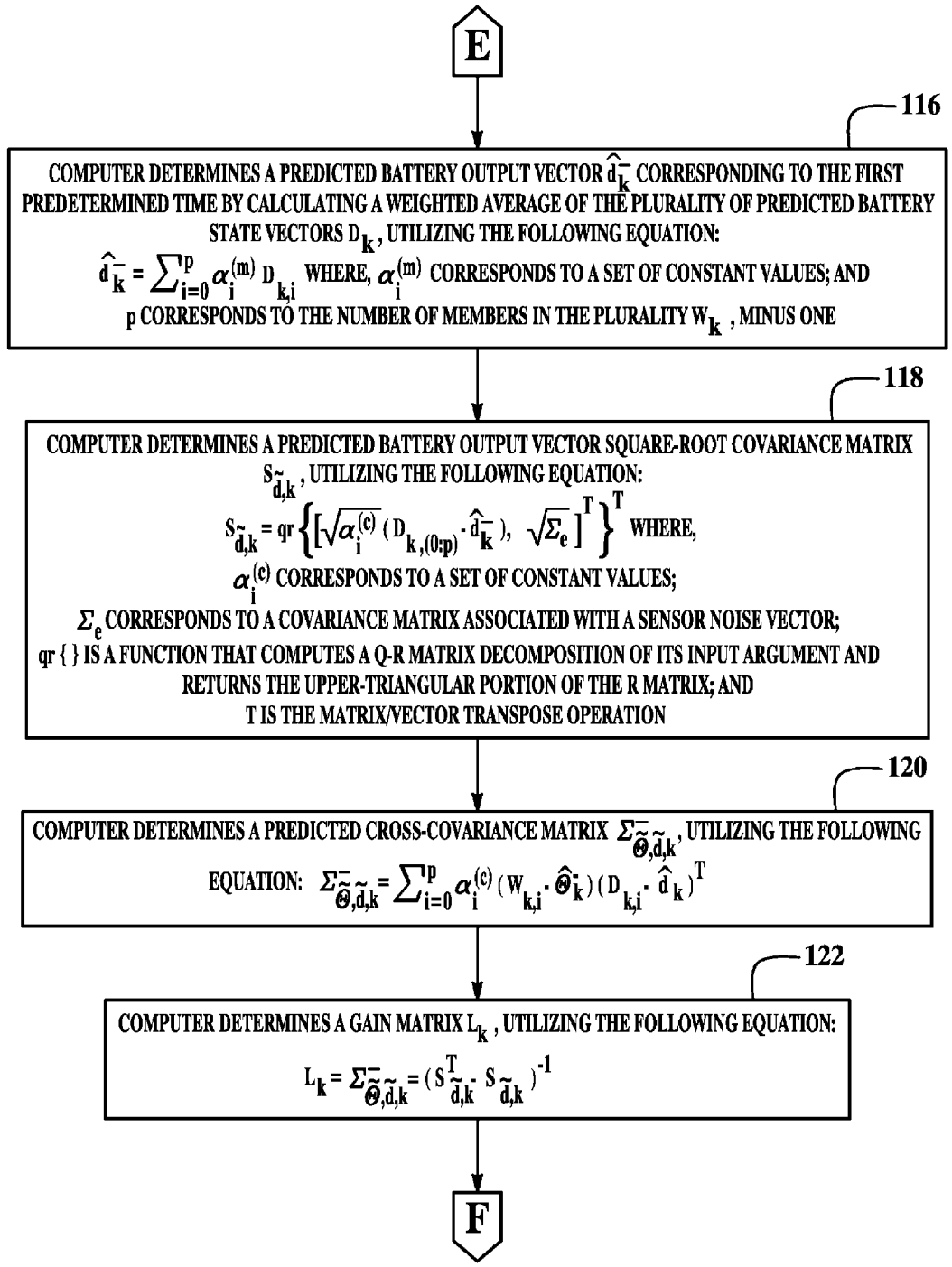
Figure 8:
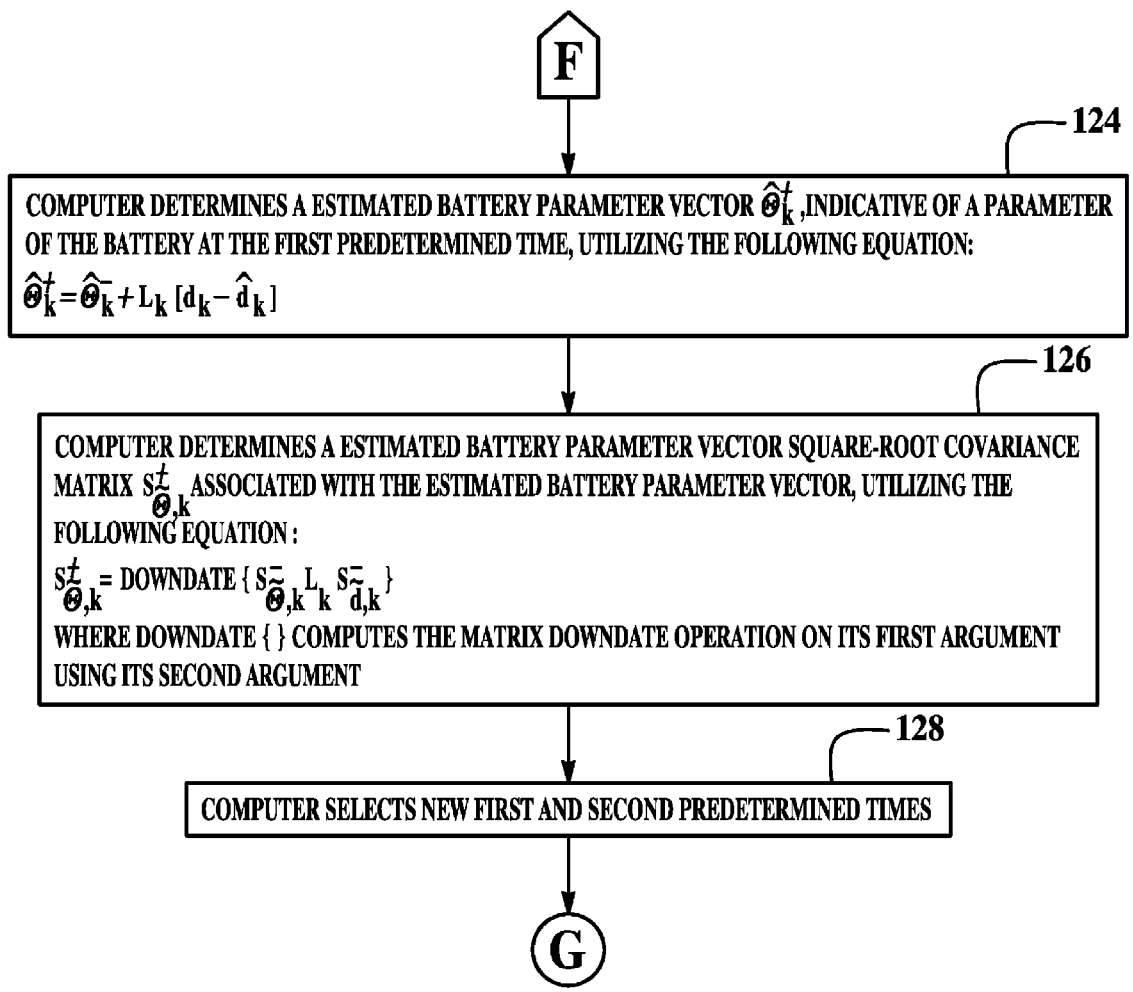

Referring to FIGS. 2-4, a method for determining an estimated battery parameter vector in accordance with an exemplary embodiment will now be explained. The method can be implemented utilizing software algorithms executed by the controller 28. The software algorithms are stored in either the ROM 44 or the RAM 45 or other computer readable mediums known to those skilled in the art.

At step 60, the computer 28 generates a battery input vector $u_k$ having at least one measured value of a battery input variable obtained at a first predetermined time.

Next at step 62, the computer 28 generates a battery state vector $x_k$ having at least one value of a battery state obtained at the first predetermined time.

Next at step 64, the computer 28 generates a battery output vector $d_k$ having at least one measured value of a battery output variable obtained at the first predetermined time.

Next at step 66, the computer 28 determines a predicted battery parameter vector $\hat{\theta}_k^-$, indicative of a parameter of the battery 12 at the first predetermined time based on an estimated battery parameter vector $\hat{\theta}_{k-1}^+$ indicative of a parameter of the battery 12 at a second predetermined time prior to the first predetermined time utilizing the following equation:

$$\hat{\theta}_k^- = \hat{\theta}_{k-1}^+.$$

Next at step 68, the computer 28 determines a predicted battery parameter vector covariance matrix $\Sigma_{\tilde{\theta},k}^-$ indicative of a covariance of a battery parameter covariance at the first predetermined time, based on an estimated battery parameter vector covariance matrix $\Sigma_{\tilde{\theta},k-1}^+$, indicative of a battery parameter covariance at the second predetermined time and a covariance matrix corresponding to a parameter noise, utilizing the following equation: $\Sigma_{\tilde{\theta},k}^- = \Sigma_{\tilde{\theta},k-1}^+ + \Sigma_{r,k-1}$ where, $\Sigma_{r,k-1}$ corresponds to a covariance matrix associated with a battery parameter noise vector.

Next at step 70, computer 28 determines a plurality of predicted battery parameter vectors $W_k$ each indicative of a parameter of a battery 12 at the first predetermined time, utilizing the following equation:

$$W_k = \{\hat{\theta}_k^-, \hat{\theta}_k^- + \gamma\sqrt{\Sigma_{\tilde{\theta},k}^-}, \hat{\theta}_k^- - \gamma\sqrt{\Sigma_{\tilde{\theta},k}^-}\}$$

where, $\sqrt{\Sigma_{\tilde{\theta},k}^-}$ corresponds to the Cholesky matrix square root of $\Sigma_{\tilde{\theta},k}^-$; and $\gamma$ corresponds to a constant value.

Next at step 72, the computer 28 determines a plurality of predicted battery output vectors $D_k$ each indicative of outputs of the battery 12 at the first predetermined time, utilizing the following equation:

$$D_{k,i} = h(x_k, u_k, \bar{v}_k, W_{k,i}, k)$$

where, $D_{k,i}$ corresponds to the ith member of the plurality $D_k$;

$W_{k,i}$ corresponds to the ith member of the plurality $W_k$;

$\bar{v}_k$ corresponds to an expected sensor noise at the first predetermined time;

k corresponds to the first predetermined time.

Next at step 74, the computer 28 determines a predicted battery output vector $\hat{d}_k^-$ corresponding to the first predetermined time by calculating a weighted average of the plurality of predicted battery state vectors $D_k$, utilizing the following equation:

$$\hat{d}_k^- = \sum_{i=0}^{p} \alpha_i^{(m)} D_{k,i}$$

where, $\alpha_i^{(m)}$ corresponds to a set of constant values; and p corresponds to the number of members in the plurality $W_k$, minus one.

Next at step 76, the computer 28 determines a predicted battery output vector covariance matrix $\Sigma_{\tilde{d},k}$, utilizing the following equation:

$$\Sigma_{\tilde{d},k} = \sum_{i=0}^{p} \alpha_i^{(c)} (D_{k,i} - \hat{d}_k)(D_{k,i} - \hat{d}_k)^T + \Sigma_e$$

where, $\alpha_i^{(c)}$ corresponds to a set of constant values;

$\Sigma_e$ corresponds to a covariance matrix associated with a battery output noise vector;

T is the matrix/vector transpose operation.

Next at step 78, the computer 28 determines a predicted cross-covariance matrix $\Sigma_{\tilde{\theta}\tilde{d},k}^-$, utilizing the following equation:

$$\Sigma_{\tilde{\theta}\tilde{d},k}^- = \sum_{i=0}^{p} \alpha_i^{(c)} (W_{k,i} - \hat{\theta}_k^-)(D_{k,i} - \hat{d}_k)^T.$$

Next at step 80, the computer 28 determines a gain matrix $L_k$, utilizing the following equation: $L_k = \Sigma_{\tilde{\theta}\tilde{d},k}^- \Sigma_{\tilde{d},k}^{-1}$.

Next at step 82, the computer 28 determines an estimated battery parameter vector $\hat{\theta}_k^+$, indicative of a parameter of the battery 12 at the first predetermined time, utilizing the following equation: $\hat{\theta}_k^+ = \hat{\theta}_k^- + L_k[d_k - \hat{d}_k]$.

Next at step 84, the computer 28 determines an estimated battery parameter vector covariance matrix $\Sigma_{\tilde{\theta},k}^+$, associated with the estimated battery parameter vector, utilizing the following equation: $\Sigma_{\tilde{\theta},k}^+ = \Sigma_{\tilde{\theta},k}^- - L_k \Sigma_{\tilde{d},k} L_k^T$.

Next at step 86, the computer 28 selects new first and second predetermined times. After step 86, method returns to step 60.

Referring to FIGS. 5-8, a method for determining an estimated battery parameter vector in accordance with an exemplary embodiment will now be explained. The method can be implemented utilizing software algorithms executed by the controller 28. The software algorithms are stored in either the ROM 44 or the RAM 45 or other computer readable mediums known to those skilled in the art.

At step 100, the computer 28 generates a battery input vector $u_k$ having at least one measured value of a battery input variable obtained at a first predetermined time.

Next at step 102, the computer 28 generates a battery state vector $x_k$ having at least one value of a battery state obtained at the first predetermined time.

Next at step 104, the computer 28 generates a battery output vector $d_k$ having at least one measured value of a battery output variable obtained at the first predetermined time.

Next at step 106, the computer 28 determines a predicted battery parameter vector $\hat{\theta}_k^-$, indicative of a parameter of the battery 12 at the first predetermined time based on an estimated battery parameter vector $\hat{\theta}_{k-1}^+$ indicative of a parameter of the battery 12 at a second predetermined time prior to the first predetermined time, utilizing the following equation:

$$\hat{\theta}_k^- = \hat{\theta}_{k-1}^+.$$

Next at step 108, the computer 28 determines a square-root covariance update matrix $D_{r,k-1}$, utilizing the following equation:

$$D_{r,k-1} = -\text{diag}\{S_{\tilde{\theta},k-1}^+\} + \sqrt{\text{diag}\{S_{\tilde{\theta},k-1}^+\}^2 + \text{diag}\{\Sigma_{r,k-1}\}}$$

where, $\Sigma_{r,k-1}$ corresponds to a covariance matrix associated with a battery parameter noise vector;

$S_{\tilde{\theta},k-1}^-$ corresponds to an estimated battery parameter vector square-root covariance matrix indicative of a covariance of a battery parameter covariance at the second predetermined time; and $\sqrt{}$ corresponds to the Cholesky matrix square root of its input argument; and diag{ } is a function that composes a square diagonal matrix formed from the diagonal elements of the input matrix.

Next at step 110, the computer 28 determines a predicted battery parameter vector square-root covariance matrix $S_{\tilde{\theta},k}^-$ indicative of a covariance of a battery parameter covariance at the first predetermined time, based on an estimated battery parameter vector covariance matrix $S_{\tilde{\theta},k-1}^+$, indicative of a battery parameter covariance at the second predetermined time and a square-root covariance update matrix utilizing the following equation: $S_{\tilde{\theta},k}^- = S_{\tilde{\theta},k-1}^+ + D_{r,k-1}$.

Next at step 112, the computer 28 determines a plurality of predicted battery parameter vectors W each indicative of a parameter of a battery 12 at the first predetermined time using the following equation: $W_k = \{(\hat{\theta}_k^-, \hat{\theta}_k^- + \gamma S_{\tilde{\theta},k}^-, \hat{\theta}_k^- - \gamma S_{\tilde{\theta},k}^-\}$ where, $\gamma$ corresponds to a constant value.

Next at step 114, the computer 28 determines a plurality of predicted battery output vectors $D_k$ each indicative of outputs of the battery at the first predetermined time, utilizing the following equation: $D_{k,i} = h(x_k, u_k, \bar{v}_k, W_k, k)$ where, $D_{k,i}$ corresponds to the ith member of the plurality $D_k$;
$W_{k,i}$ corresponds to the ith member of the plurality $W_k$;
$\bar{v}_k$ corresponds to an expected sensor noise at the first predetermined time;
k corresponds to the first predetermined time.

Next at step 116, the computer 28 determines a predicted battery output vector $\hat{d}_k^-$ corresponding to the first predetermined time by calculating a weighted average of the plurality of predicted battery state vectors $D_k$, utilizing the following equation:

$$\hat{d}_k^- = \Sigma_{i=0}^p \alpha_i^{(m)} D_{k,i}$$

where, $\alpha_i^{(m)}$ corresponds to a set of constant values; and
p corresponds to the number of members in the plurality $W_k$, minus one.

Next at step 118, the computer 28 determines a predicted battery output vector square-root covariance matrix $S_{\tilde{d},k}$, utilizing the following equation:

$$S_{\tilde{d},k} = qr\{[\sqrt{\alpha_i^{(c)}}(D_{k,(0:p)} - \hat{d}_k^-), \sqrt{\Sigma_e}]^T\}^T.$$

where, $\alpha_i^{(c)}$ corresponds to a set of constant values;
$\Sigma_e$ corresponds to a covariance matrix associated with a sensor noise vector;
qr{ } is a function that computes a Q-R matrix decomposition of its input argument and returns the upper-triangular portion of the R matrix; and
T is the matrix/vector transpose operation.

Next at step 120, the computer 28 determines a predicted cross-covariance matrix $\Sigma_{\tilde{\theta}\tilde{d},k}^-$, utilizing the following equation: $\Sigma_{\tilde{\theta}\tilde{d},k}^- = \Sigma_{i=0}^p \alpha_i^{(c)} (W_{k,i} - \hat{\theta}_k^-)(D_{k,i} - \hat{d}_k)^T$.

Next at step 122, the computer 28 determines a gain matrix $L_k$, utilizing the following equation: $L_k = \Sigma_{\tilde{\theta}\tilde{d},k}^- (S_{\tilde{d},k}^T S_{\tilde{d},k})^{-1}$.

Next at step 124, computer 28 determines an estimated battery parameter vector $\hat{\theta}_k^+$, indicative of a parameter of the battery 12 at the first predetermined time, utilizing the following equation: $\hat{\theta}_k^+ = \hat{\theta}_k^- + L_k[d_k - \hat{d}_k]$.

Next at step 126, the computer 28 determines an estimated battery parameter vector square-root covariance matrix $S_{\tilde{\theta},k}^+$, associated with the estimated battery parameter vector, utilizing the following equation: $S_{\tilde{\theta},k}^+ = \text{downdate } \{S_{\tilde{\theta},k}^-, L_k S_{\tilde{d},k}\}$, where downdate{ } computes the matrix downdate operation on its first argument using its second argument.

Next at step 128, the computer 28 selects new first and second predetermined times after step 428, the method returns to step 100.

The system, method, and article of manufacture for determining an estimated battery parameter vector provide a substantial advantage over other systems and methods. In particular, the system, method, and article of manufacture provide a technical effect of more accurately determining the battery parameter vector for a battery having non-linear operational characteristics.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to the exemplary embodiments, it will be understood by those skilled in the art that various changes may be made and equivalent elements may be substituted for elements thereof without departing from the scope of the invention. In addition, many modifications may be made to the teachings of the invention to adapt to a particular situation without departing from the scope thereof. Therefore, is intended that the invention not be limited the embodiment disclosed for carrying out this invention, but that the invention includes all embodiments falling with the scope of the intended claims. Moreover, the use of the terms first, second, etc. does not denote any order of importance, but rather the terms first, second, etc. are used to distinguish one element from another.

What is claimed is:

1. A system for determining an estimated battery parameter vector indicative of a parameter of a battery at a first predetermined time, the system comprising:
   a sensor configured to generate a first signal indicative of an output variable of the battery; and
   a computer operably coupled to the sensor, the computer configured to determine a first plurality of predicted battery parameter vectors that are indicative of the parameter of the battery and an uncertainty of the parameter of the battery at the first predetermined time, the computer further configured to determine a battery state vector having at least one value indicative of a battery state at the first predetermined time, the computer further configured to determine a second plurality of predicted battery output vectors that are indicative of at least one output variable of the battery and an uncertainty of the output variable at the first predetermined time based on the first plurality of predicted battery parameter vectors and the battery state vector, the computer further configured to determine a first battery output vector based on the first signal, the computer further configured to determine a first estimated battery parameter vector indicative of the parameter of the battery at the first predetermined time based on the first plurality of predicted battery parameter vectors, the second plurality of predicted battery output vectors, and the first battery output vector.

2. The system of claim 1, wherein the computer is further configured to retrieve an estimated battery parameter vector indicative of the parameter of the battery at the second predetermined time from a memory, the computer further configured to retrieve an estimated battery parameter vector covariance matrix indicative of an uncertainty of the parameter of the battery at the second predetermined time from the memory, the computer further configured to determine an estimated battery parameter noise covariance matrix indicative of an uncertainty of a parameter noise at the second predetermined time, the computer further configured to calculate the first plurality of predicted battery parameter vectors based on the estimated battery parameter vector, the estimated battery parameter vector covariance matrix, and the estimated battery parameter noise covariance matrix.

3. The system of claim 1, wherein the computer is further configured to retrieve an estimated battery parameter vector indicative of the parameter of the battery at the second predetermined time from a memory, the computer further configured to retrieve an estimated battery parameter vector square-root covariance matrix indicative of an uncertainty of the parameter of the battery at the second predetermined time from the memory, the computer further configured to determine an estimated battery parameter noise square-root covariance matrix indicative of an uncertainty of a parameter noise at the second predetermined time, the computer further configured to calculate the first plurality of predicted battery parameter vectors based on the estimated battery parameter vector, the estimated battery parameter vector square-root covariance matrix, and the estimated battery parameter noise square-root covariance matrix.

4. The system of claim 1, wherein the computer is further configured to determine a first predicted battery output vector indicative of at least one output variable of the battery at the first predetermined time based on the second plurality of predicted battery output vectors, the computer further configured to determine a gain matrix based on the first predicted battery parameter vector, the first predicted battery output vector, the first plurality of predicted battery parameter vectors, and the second plurality of predicted battery output vectors, the computer further configured to calculate the first estimated battery parameter vector based on the first predicted battery parameter vector, the first predicted battery output vector, the gain matrix, and the first battery output vector.

* * * * *